(12) United States Patent
Shumaker et al.

(10) Patent No.: US 11,005,481 B2
(45) Date of Patent: May 11, 2021

(54) SYSTEMS AND METHODS FOR MITIGATION OF NONLINEARITY RELATED PHASE NOISE DEGRADATIONS

(71) Applicant: Apple Inc., Cupertino, CA (US)

(72) Inventors: Evgeny Shumaker, Nesher (IL); Gil Horovitz, Emek-Hefer (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/204,109

(22) Filed: Nov. 29, 2018

(65) Prior Publication Data

US 2020/0177190 A1 Jun. 4, 2020

(51) Int. Cl.
*H03L 7/14* (2006.01)
*H03L 7/087* (2006.01)
(Continued)

(52) U.S. Cl.
CPC .............. *H03L 7/087* (2013.01); *H03L 7/099* (2013.01); *H03L 7/141* (2013.01); *H03L 7/143* (2013.01);
(Continued)

(58) Field of Classification Search
CPC ......... G04F 10/00; G04F 10/005; H03K 3/84; H03K 5/26; H03L 7/00; H03L 7/10;
(Continued)

(56) References Cited

U.S. PATENT DOCUMENTS 10,108,148 B1 * 10/2018 Testi ..................... G04F 10/005
10,498,344 B2 * 12/2019 Janardhanan .......... H03L 7/093
(Continued)

FOREIGN PATENT DOCUMENTS

EP     3035535 A1     6/2016

OTHER PUBLICATIONS

Avivi Rotem et al; "Adaptive Spur Cancellation Technique in All-Digital Phase-Locked Loops"; IEEE Transactions on Circuits and Systems II: Express Briefs; vol. 64, No. 11; Nov. 1, 2017.
(Continued)

*Primary Examiner* — Shawkat M Ali
(74) *Attorney, Agent, or Firm* — Eschweiler & Potashnik, LLC

(57) ABSTRACT

A phase locked loop (PLL) system for mitigating non-linear phase errors stemming from time-variant integral non-linearity of the LO feedback phase quantizer (TDC) is disclosed. The system includes a phase modulation circuit which is configured to generate a plurality of phase shifts for a reference signal; select a phase shift of the plurality of phase shifts and introduce the selected phase shift into the reference signal, thereby modulating the phase difference between the feedback and the reference signal. Alternatively, the above phase modulation can be applied on the feedback signal path, attaining equivalent results. TDC is configured to quantize the phase of the LO feedback signal relative to the shifted reference signal to generate a phase detection signal, effectively modulating the non-linearity contributed error away from the LO center frequency. The phase detection signal is then digitally compensated for the intentional fractional frequency shift to allow the PLL to generate LO signal the desired frequency.

20 Claims, 16 Drawing Sheets

(51) Int. Cl.
*H03L 7/099* (2006.01)
*H03L 7/18* (2006.01)
*H04L 27/00* (2006.01)

(52) U.S. Cl.
CPC ........ *H03L 7/1806* (2013.01); *H04L 27/0014* (2013.01); *H04L 2027/0067* (2013.01)

(58) Field of Classification Search
CPC ......... H03L 7/14; H03L 7/0085; H03L 7/087; H03L 7/091; H03L 7/093; H03L 7/099; H03L 7/143; H03L 7/1806; H03M 1/06; H03M 1/12; H03M 3/00; H04B 1/16; H04B 7/00; H04L 7/033; H04L 277/0014
USPC ........ 327/142, 156, 158, 159; 341/120, 143; 375/371, 375, 376
See application file for complete search history.

(56) References Cited

U.S. PATENT DOCUMENTS

| | | | |
|---|---|---|---|
| 2008/0315959 A1 | 12/2008 | Zhuang | |
| 2015/0084676 A1* | 3/2015 | McLaurin | H03L 7/085 327/142 |
| 2015/0241850 A1* | 8/2015 | Henzler | G04F 10/005 341/120 |
| 2018/0269885 A1* | 9/2018 | Kondo | H03L 7/0992 |

OTHER PUBLICATIONS

International Search Report and Written Opinion dated Jan. 21, 2020 in connection with International Application No. PCT/US2019/057566.

* cited by examiner

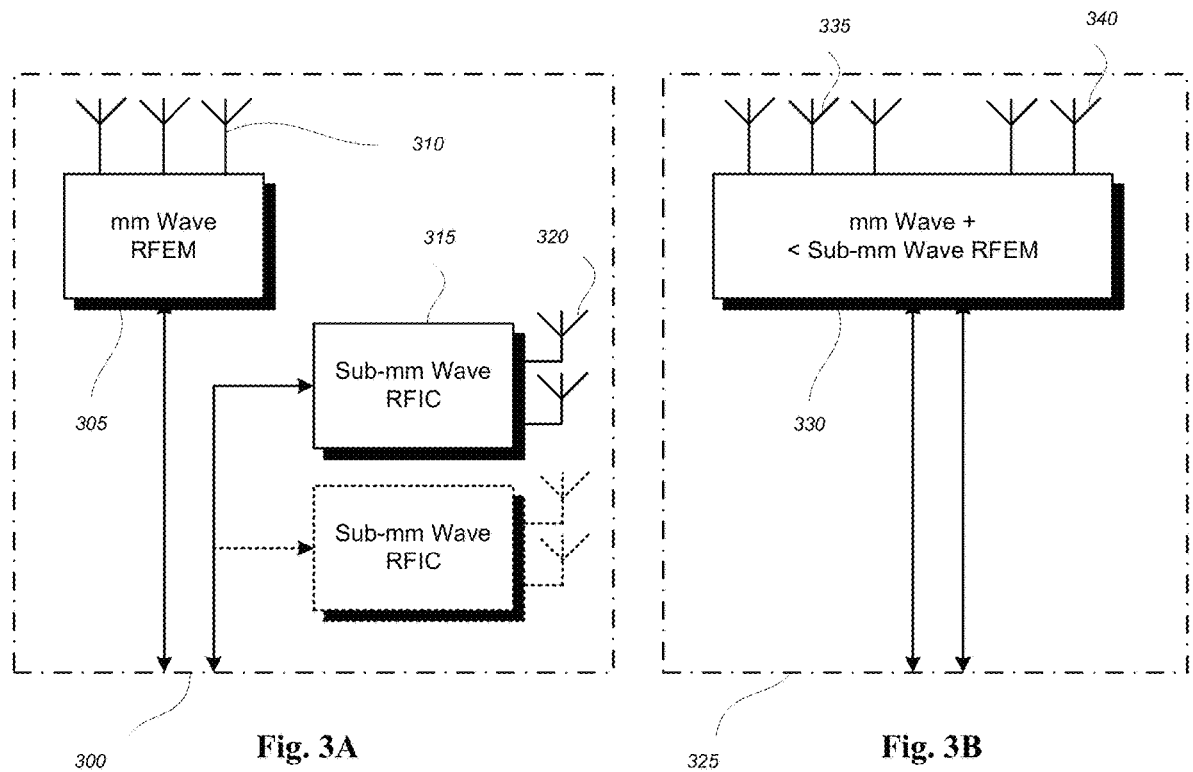

US 11,005,481 B2

SYSTEMS AND METHODS FOR MITIGATION OF NONLINEARITY RELATED PHASE NOISE DEGRADATIONS

FIELD

Various embodiments generally relate to the field of signal processing.

BACKGROUND

Wireless communications continually increase in speed and throughput. The more throughput, the more that devices that utilize wireless communications can do.

One limitation to the speeds and throughput is the presence of noise. The noise can cause retransmissions, erroneous communications, unreliable communications and the like.

Techniques to reduce the noise present in wireless communications are needed.

BRIEF DESCRIPTION OF THE DRAWINGS

FIG. 3A and FIG. 3B illustrate aspects of an exemplary radio front end module.

DETAILED DESCRIPTION

Figure 1:
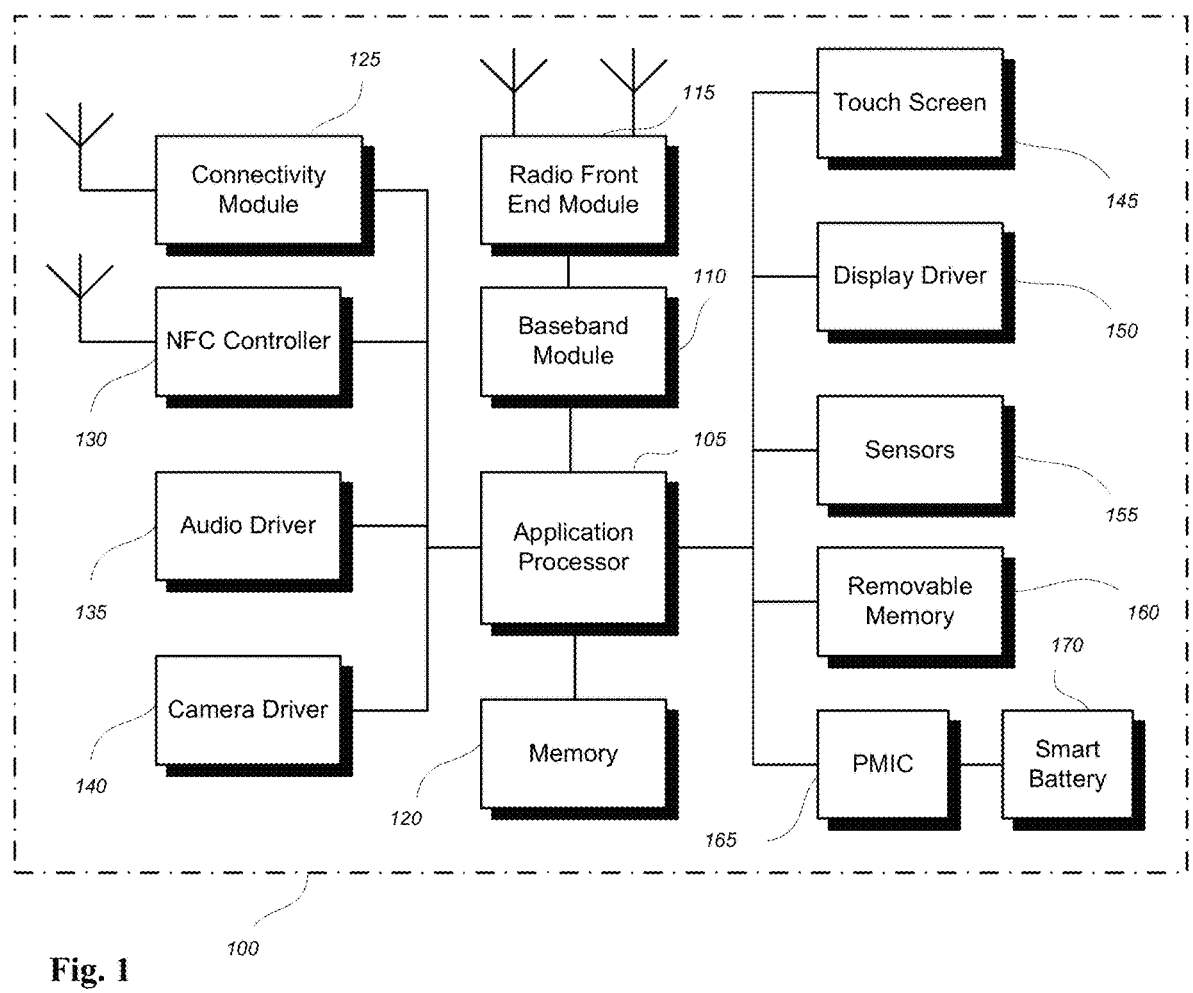
FIG. 1 illustrates an exemplary user device in accordance with an aspect.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1, RAN2, 5G and the like.

As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Fractional frequency synthesis is used in current communications, standards and future communication standards. Fractional frequency synthesis is also used for data processing architectures, regardless of the implementation chosen.

The name, fractional frequency synthesis, is derived from the fact that a final local oscillator output frequency ($f_{LO}$) creates a non-zero fraction when divided by the reference (REF) clock frequency ($f_{REF}$), such that $$\frac{f_{LO}}{f_{REF}} = N + \frac{p}{q} \quad (1)$$

where N is the multiplication (from $f_{REF}$ to $f_{LO}$) integer, and p/q denotes the fraction.

Phase-locked loops (PLLs) are typically used to implement the frequency synthesis function. In PLL based fractional frequency synthesis arrangements, a local oscillator (LO) phase is juxtaposed/compared to a reference signal (REF) phase to yield phase error. This phase error can be used to issue correction commands to the local oscillator (LO). In analog implementations, this comparison is performed continuously where as in digital implementations, such as digital phase locked loops (DPLLs), the comparison is sample based (or discrete).

The DPLLs are emerging as the implementations of choice for fractional synthesizers. Further, this type of PLL, the DPLL allows for broad employment of digital signal processing (DSP) techniques, which can further improve performance and communication.

Additionally, comparators or quantizers suffer from numerous non-idealities, which can be difficult to mitigate.

Integral nonlinearities cause a reported phase delta to differ from an actual phase delta, which introduces periodic phase errors. This is due to the periodic nature of the fractional phase evolution—it may take as long as q steps for the fraction p/q to contribute an integer, or differently-put, to return to the original phase state (complete their evolution cycle). Since the correction commands stemming from this comparison undergo low-pass filtering within the PLL, they persist at the output of the LO as perfectly periodic modulations, which are also referred to as spurs.

It is appreciated that the above impairments ultimately degrade the spectral purity of the synthesizer output. Such fractions (p/q ratios for which the error evolution cycles falls within the PLL filtering bandwidth) are denoted as "bad fractions", as opposed to "good fractions", which feature moderate length evolution cycle.

At the opposite end of the fraction spectrum, lie the ultra-fast evolving fractions, such as an integer, ½, ⅓, ¼, and the like. For these, differential non-linearity variations (variations of the phase-code curve slope) introduce loop gain variations, which alter the locking bandwidth to a sub-optimal value. This phenomenon typically manifests itself as significant integrated phase noise (iPN) variations in the locked state.

Embodiments and/or aspects are disclosed that modulate an input of a phase difference quantizer of a digital phase locked loop (DPLL) and/or an all digital phase locked loop (ADPLL) to cause "bad fractions" to interpose or operate as "good fractions". The modulation is performed with a selected modulation scheme, which is selected to mitigate spurious contribution to integrated phase noise for a frequency on a very dense channel grid. An example of a dense channel grid is the 5G cellular communication standard. The modulation is then compensated for prior to computation of a loop phase error of the DPLL. The compensation is performed digitally using pre-calibrated values.

FIG. 1 illustrates a user device 100 in accordance with an aspect. The user device 100 may be a mobile device or a wearable device in some aspects and includes an application processor 105, baseband processor 110 (also referred to as a baseband module), radio front end module (RFEM) 115, memory 120, connectivity module 125, near field communication (NFC) controller 130, audio driver 135, camera driver 140, touch screen 145, display driver 150, sensors 155, removable memory 160, power management integrated circuit (PMIC) 165 and smart battery 170. The user device 100 can include and/or be incorporated with human proximity sensing circuitry.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit ($I^2C$) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 110 may be implemented, for example, as a solder-down substrate including one or more integrated circuits, a single packaged integrated circuit soldered to a main circuit board, and/or a multi-chip module containing two or more integrated circuits.

Figure 2:
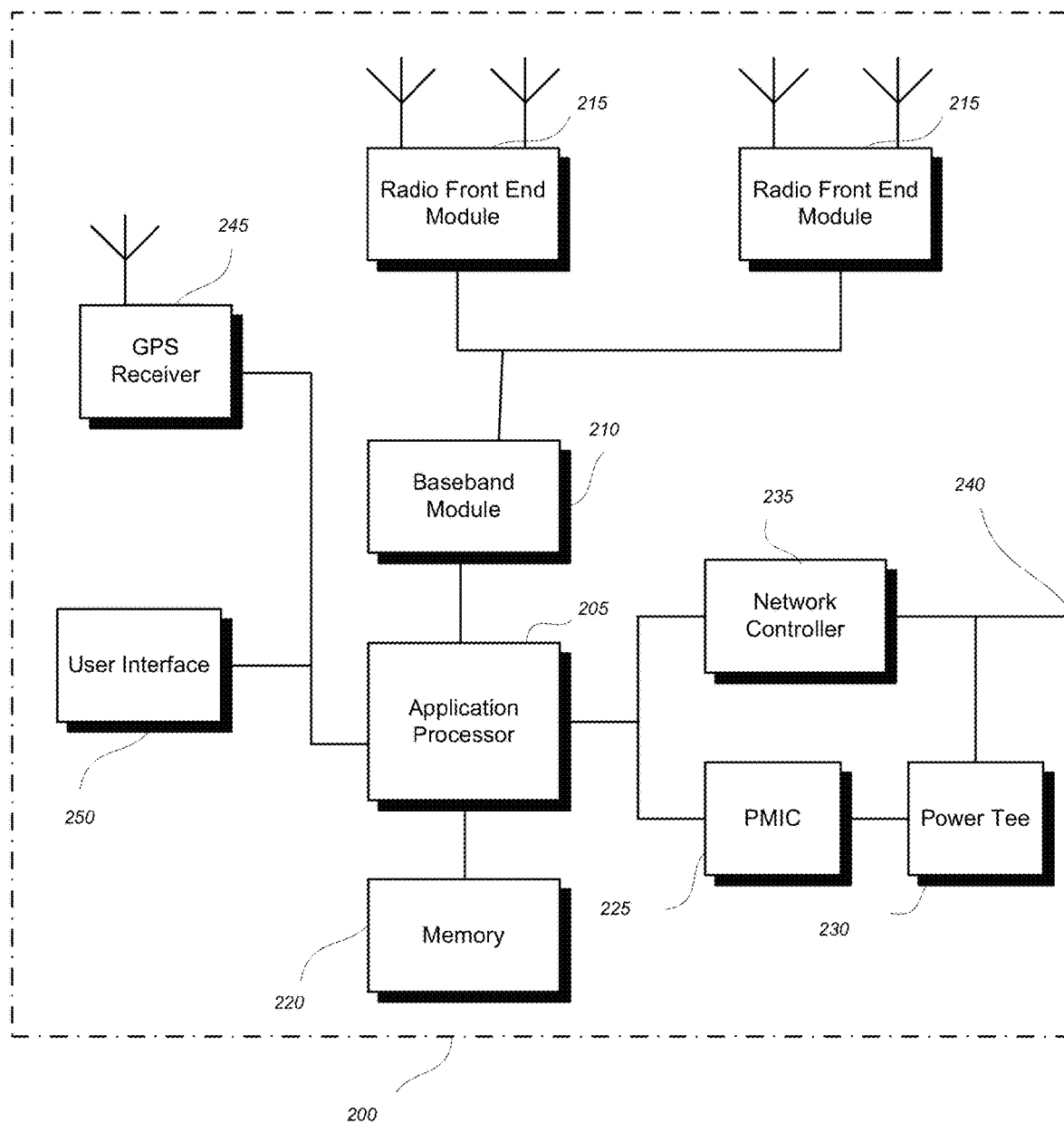
FIG. 2 illustrates an exemplary base station or infrastructure equipment radio head in accordance with an aspect.

FIG. 2 illustrates a base station or infrastructure equipment radio head 200 in accordance with an aspect. The base station radio head 200 may include one or more of application processor 205, baseband modules 210, one or more radio front end modules 215, memory 220, power management circuitry 225, power tee circuitry 230, network controller 235, network interface connector 240, satellite navigation receiver module 245, and user interface 250.

In some aspects, application processor 205 may include one or more CPU cores and one or more of cache memory, low drop-out voltage regulators (LDOs), interrupt controllers, serial interfaces such as SPI, $I^2C$ or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

It is appreciated that the radio head 200 can also include a single RF front end module, including a single RF front end module for MIMO.

FIG. 3A and FIG. 3B illustrate aspects of a radio front end module.

FIG. 3A illustrates an aspect of a radio front end module 300 incorporating a millimeter wave radio front end module (RFEM) 305 and one or more sub-millimeter wave radio frequency integrated circuits (RFIC) 315. In this aspect, the one or more sub-millimeter wave RFICs 315 may be physically separated from a millimeter wave RFEM 305. RFICs 315 may include connection to one or more antennas 320. RFEM 305 may be connected to multiple antennas 310.

FIG. 3B illustrates an alternate aspect of a radio front end module 325. In this aspect, both millimeter wave and sub-millimeter wave radio functions may be implemented in the same physical radio front end module 330. RFEM 330 may incorporate both millimeter wave antennas 335 and sub-millimeter wave antennas 340.

Figure 4A:
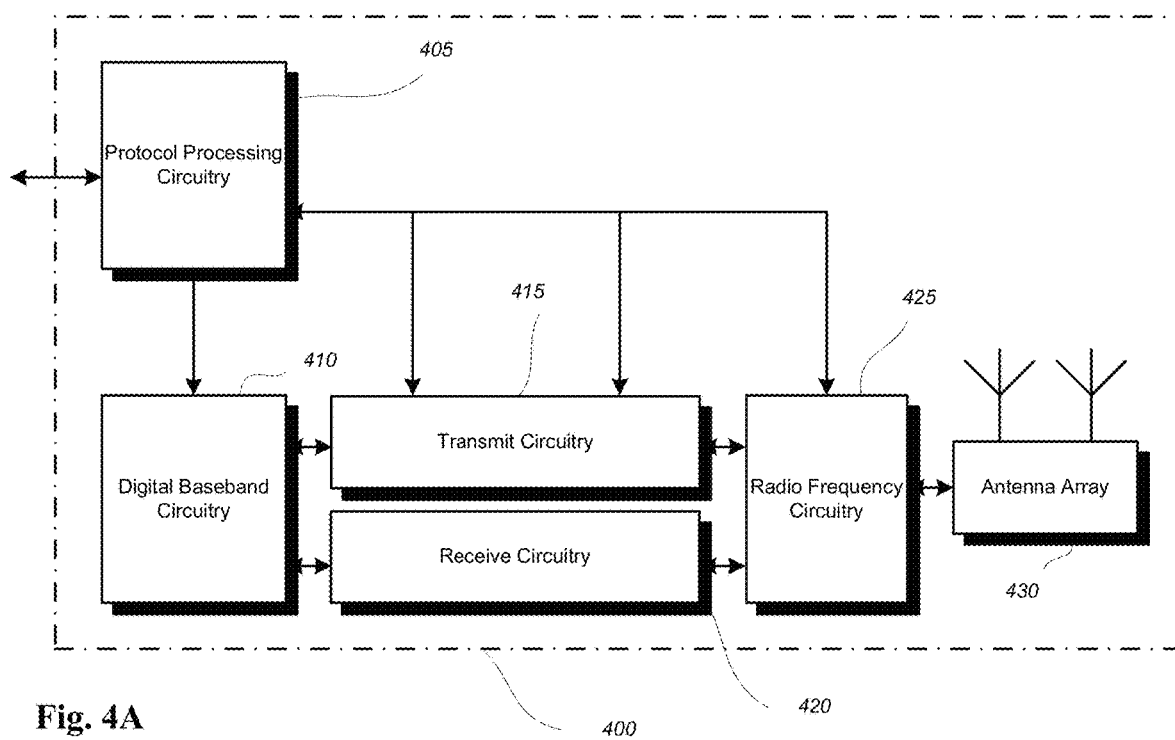
FIG. 4A illustrates an exemplary millimeter wave communication circuitry according to some aspects.

FIG. 4A illustrates an exemplary millimeter wave communication circuitry 400 according to some aspects. Circuitry 400 is alternatively grouped according to functions. Components as shown in 400 are shown here for illustrative purposes and may include other components not shown here in FIG. 4A.

Millimeter wave communication circuitry 400 may include protocol processing circuitry 405, which may implement one or more of medium access control (MAC), radio link control (RLC), packet data convergence protocol (PDCP), radio resource control (RRC) and non-access stratum (NAS) functions. Protocol processing circuitry 405 may include one or more processing cores (not shown) to execute instructions and one or more memory structures (not shown) to store program and data information.

Millimeter wave communication circuitry 400 may further include digital baseband circuitry 410, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 400 may further include transmit circuitry 415, receive circuitry 420 and/or antenna array circuitry 430.

Millimeter wave communication circuitry 400 may further include radio frequency (RF) circuitry 425. In an aspect of the invention, RF circuitry 425 may include multiple parallel RF chains for one or more of transmit or receive functions, each connected to one or more antennas of the antenna array 430.

In an aspect of the disclosure, protocol processing circuitry 405 may include one or more instances of control circuitry (not shown) to provide control functions for one or more of digital baseband circuitry 410, transmit circuitry 415, receive circuitry 420, and/or radio frequency circuitry 425.

Figure 4B:
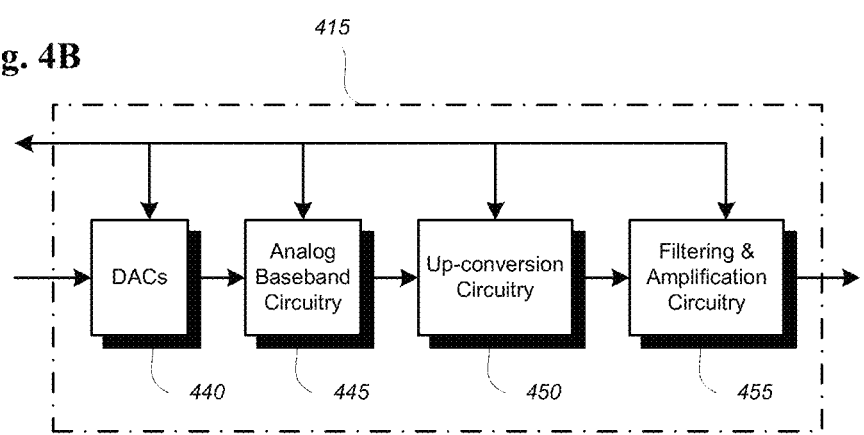
FIGS. 4B and 4C illustrate examples for transmit circuitry in FIG. 4A in some aspects.
Figure 4C:
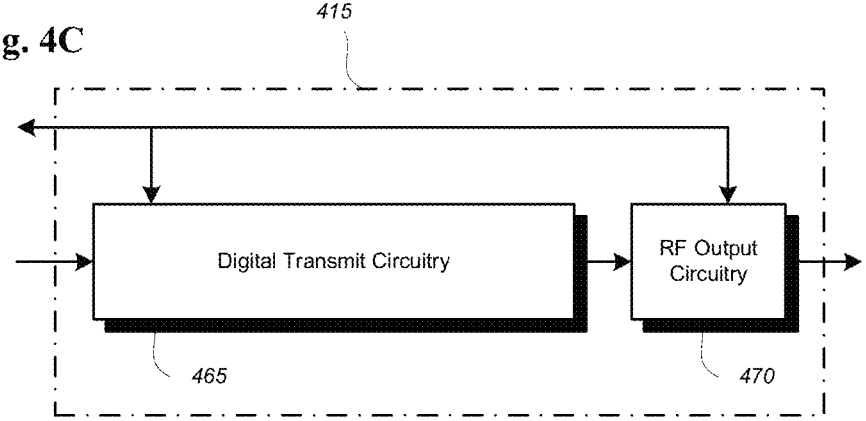

FIGS. 4B and 4C illustrate examples for transmit circuitry 415 in FIG. 4A in some aspects.

The exemplary transmit circuitry 415 of FIG. 4B may include one or more of digital to analog converters (DACs) 440, analog baseband circuitry 445, up-conversion circuitry 450 and filtering and amplification circuitry 455. In another aspect, 4C illustrates an exemplary transmit circuitry 415 which includes digital transmit circuitry 465 and output circuitry 470.

Figure 4D:
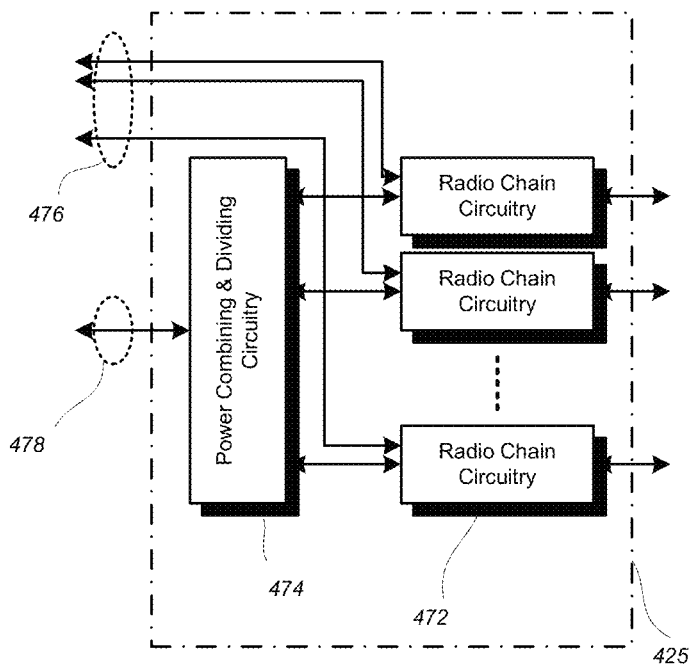
FIG. 4D illustrates an exemplary radio frequency circuitry in FIG. 4A according to some aspects.

FIG. 4D illustrates an exemplary radio frequency circuitry 425 in FIG. 4A according to some aspects.

Radio frequency circuitry 425 may include one or more instances of radio chain circuitry 472, which in some aspects may include one or more filters, power amplifiers, low noise amplifiers, programmable phase shifters and power supplies (not shown).

Radio frequency circuitry 425 may include power combining and dividing circuitry 474 in some aspects. In some aspects, power combining and dividing circuitry 474 may operate bidirectionally, such that the same physical circuitry may be configured to operate as a power divider when the device is transmitting, and as a power combiner when the device is receiving. In some aspects, power combining and dividing circuitry 474 may include one or more wholly or partially separate circuitries to perform power dividing when the device is transmitting and power combining when the device is receiving. In some aspects, power combining and dividing circuitry 474 may include passive circuitry comprising one or more two-way power divider/combiners arranged in a tree. In some aspects, power combining and dividing circuitry 474 may include active circuitry comprising amplifier circuits.

In some aspects, radio frequency circuitry 425 may connect to transmit circuitry 415 and receive circuitry 420 in FIG. 4A via one or more radio chain interfaces 476 or a combined radio chain interface 478.

In some aspects, one or more radio chain interfaces 476 may provide one or more interfaces to one or more receive or transmit signals, each associated with a single antenna structure which may comprise one or more antennas.

In some aspects, the combined radio chain interface 478 may provide a single interface to one or more receive or transmit signals, each associated with a group of antenna structures comprising one or more antennas.

Figure 4E:
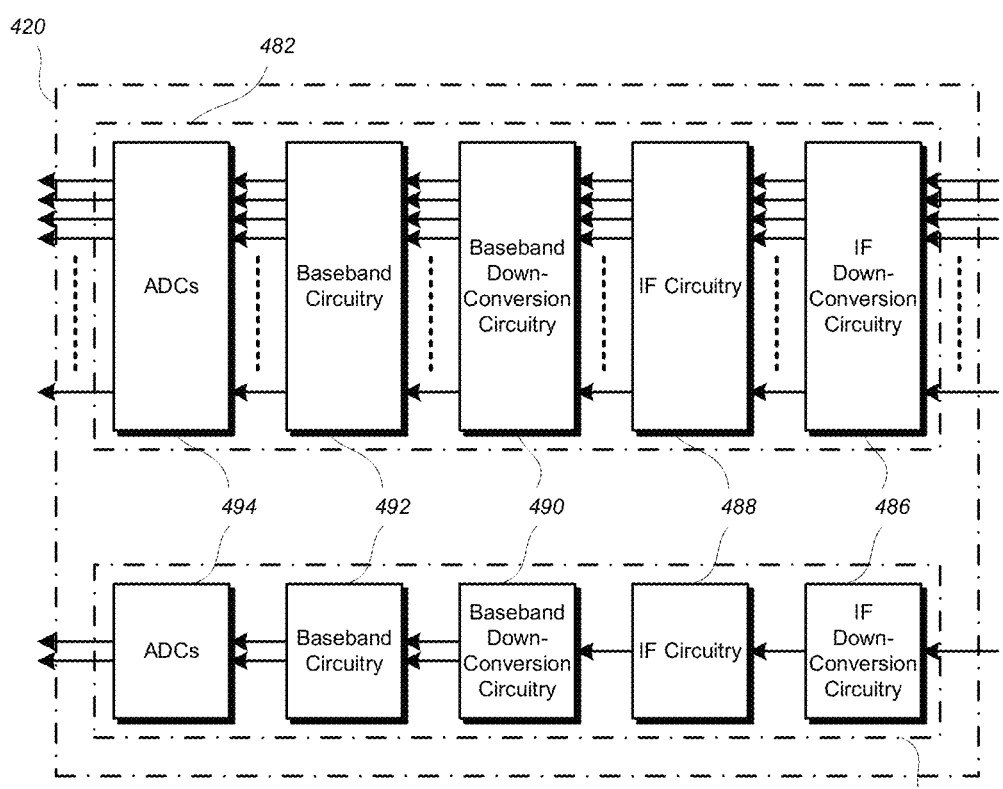
FIG. 4E illustrates exemplary receive circuitry in FIG. 4A according to some aspects.

FIG. 4E illustrates exemplary receive circuitry 420 in FIG. 4A according to some aspects. Receive circuitry 420 may include one or more of parallel receive circuitry 482 and/or one or more of combined receive circuitry 484.

In some aspects, the one or more parallel receive circuitry 482 and one or more combined receive circuitry 484 may include one or more Intermediate Frequency (IF) down-conversion circuitry 486, IF processing circuitry 488, baseband down-conversion circuitry 490, baseband processing circuitry 492 and analog-to-digital converter (ADC) circuitry 494.

Figure 5A:
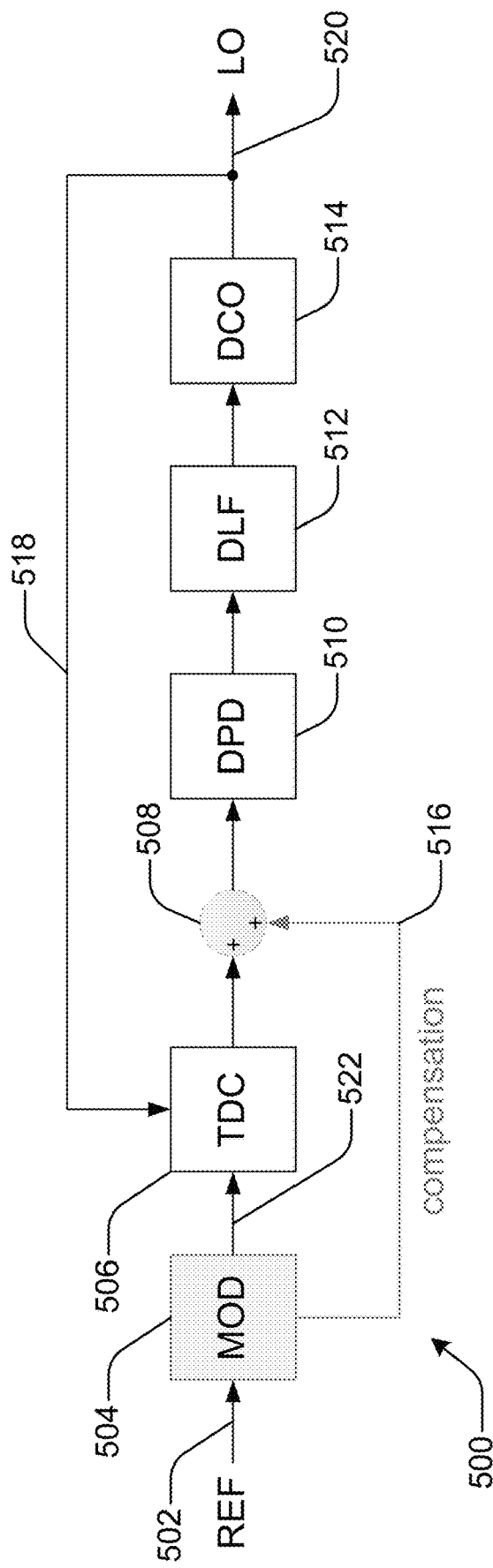
FIGS. 5A and 5B illustrate example arrangements for an all digital phase locked loop (ADPLL) system in accordance with some embodiments and/or aspects.
Figure 5B:
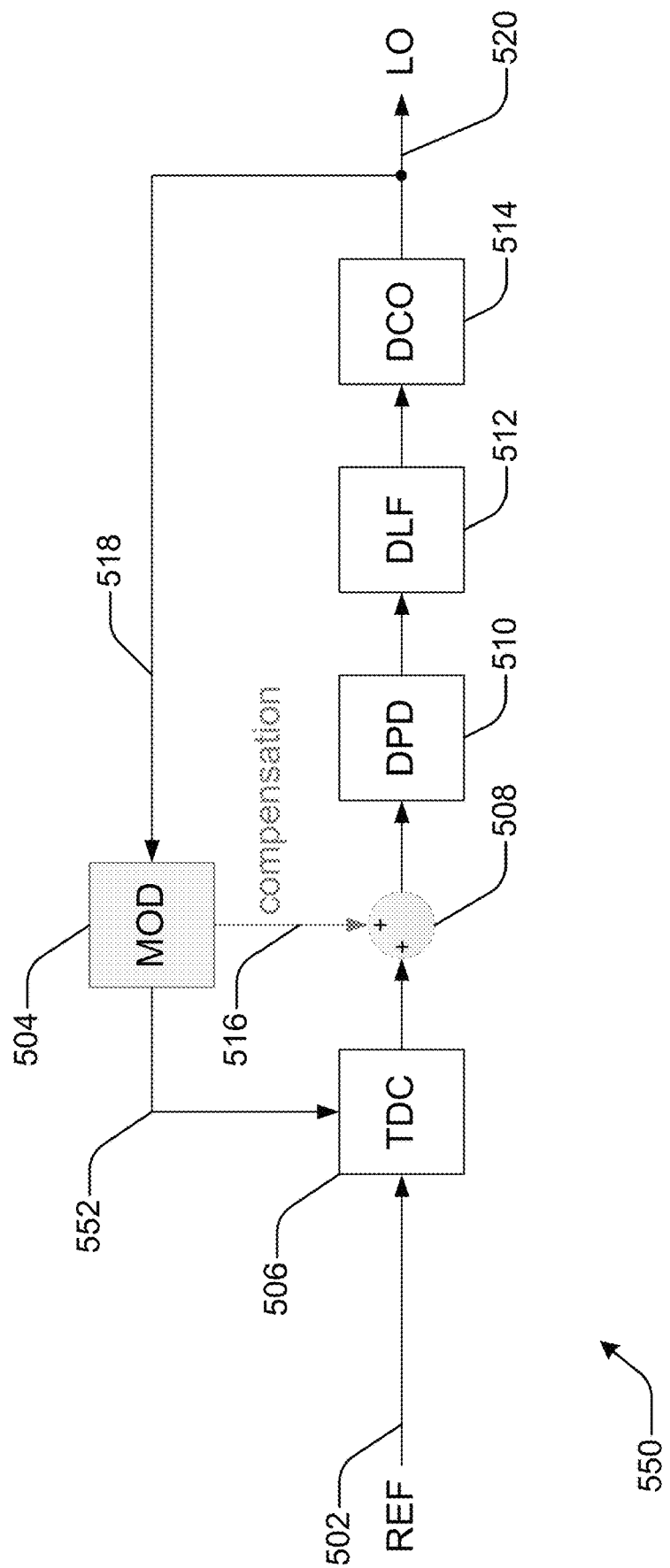

FIG. 5 is a diagram illustrating suitable example arrangements for an all digital phase locked loop (ADPLL) system in accordance with some embodiments and/or aspects. FIG. 5 includes FIG. 5A and FIG. 5B. Both systems 500 and 550 introduce phase modulation at an input of a phase difference quantizer to mitigate spurious contribution to integrated phase noise. The system 500 introduces the modulation on the reference signal path whereas the system 550 introduces the modulation on the feedback signal path. Any reference to system 500 hereon can be replaced with the reference to system 550.

The system 500 can be implemented in front end circuitry, such as the radio front end module 115, the radio front end module 215, the radio front end module 300, the radio front end module 325 and variations thereof. The system 500 can be used with user device 100, a base station or infrastructure equipment radio head 200 and the like.

The system 500 is provided at a high level to facilitate understanding. It is appreciated that other circuits and the like can be included. Additional details and examples are provided in subsequent figures and description.

The system 500 causes fractional frequency values as defined in equation (1) that cause substantial non-linearity related phase errors (and therefore referred to as "bad fractions" henceforth) to operate as fractional frequency values that have relatively low non-linearity related phase errors (referred to as "good fractions). As a result, non-linear phase errors are mitigated.

The ADPLL system 500 includes a phase modulation circuitry 504, a time to digital converter (TDC) 506, a combiner or adder circuitry 508, a digital phase detector (DPD) 510, digital loop filter (DLF) 512 and a digitally controlled oscillator (DCO) 514.

The system 500 generates an output signal 520 having its phase related to an input signal or reference signal 502. The output signal 520 is a local oscillator (LO) signal.

The modulation circuit 504 introduces a phase modulation into the reference signal 502 and passes the phase modulated reference signal as its output. The introduced phase modulation is also referred to as an intentional phase modulation.

The modulation circuit 504 also generates a correction or compensation 516, which is combined with the TDC output by circuitry 508 as a compensated phase detection signal.

The TDC 506 can also be referred to as a phase difference meter. The TDC 506 receives the phase modulated reference signal and a feedback signal 518 and generates a phase detection signal. The feedback signal 518 is the output signal 520 or is derived from the output signal 520.

The DPD 510 uses the phase detection signal produced by the TDC 506 to compute a phase error signal.

The DLF 512 filters away high frequency variations, noise and the like from the phase error signal.

The DCO 514 generates the output signal 520. The DCO 514 can also be referred to as a digital voltage controlled oscillator.

In some embodiments of the system 500, the non-linearity related phase errors are of purely periodic nature and hence appear at discrete frequency offsets from the main LO carrier. These modulations are often referred to as spurious signals, or simply "spurs". Owing their periodicity to the fractional frequency as defined by equation (1), they are classified as "fractional spurs". The modulation circuit 504 mitigates the occurrence of fractional spurs at the LO 520 by introducing the phase modulation. The phase modulation is selected and/or generated to mitigate the occurrence of fractional spurs, reduce noise resulting from the fractional spurs, and the like.

In one example, the modulation circuit 504 is configured to generate a plurality of phase shifts for a signal. The modulation circuit 504 then selects a phase shift from the plurality of phase shifts. The phase shift can be selected that mitigates a non-linear phase error by a suitable amount and/or within a selected threshold. In one example, the selection of the phase shift is based on a map, such as the map 1300 shown below. The modulation circuit 504 uses the selected phase shift and introduces the selected phase shift into the reference signal 502. The modulation circuit 504 is also configured to generate a compensation signal.

The modulation circuit 504 can also be configured to identify or determine a shift fraction used to generate the plurality of phase shifts. It's also appreciated, that various dithering techniques (such as Sigma-Delta modulation) can be applied to noise-shape the residual phase error if the desired fractional frequency shift is not directly achievable with the plurality of phase shift availed by the modulation circuit 504.

It is appreciated that suitable variations of the system 500 are contemplated. Additionally, it is appreciated that the modulation circuit 504 can be incorporated into other systems and/or arrangements to mitigate the occurrence of phase detector errors, and the like.

The system 500 is described with respect to an ADPLL. However, it is appreciated that the modulation circuit 504 and other elements can be used with other types of PLLs, such as DPLLs.

Generally, the operation of the TDC 506 and similar TDCs used in PLL systems provides a phase of the feedback signal 518 sampled at $T_{REF}=1/f_{REF}$ intervals, where $f_{REF}$ is the frequency of the reference signal 502. The phase at sample n is given by $$\varphi_{LO}[n] = \varphi_0 + 2\pi f_{LO} n T_{REF} = \varphi_0 + 2\pi \frac{f_{LO}}{f_{REF}} n \qquad (2)$$

The step-to-step phase increment is also referred to as normalized frequency and can be written as (see also Equation (1)):

$$\tilde{f}_{LO} \equiv \frac{f_{LO}}{f_{REF}} = N + \frac{p}{q} = INT + FRAC \quad (3)$$

where N=INT is the integer quotient which advances the phase by full cycles (2π) and p/q=FRAC is the division fraction which advances the phase by a fraction of a cycle, and hence is termed fractional frequency.

It is appreciated that suitable variations of the system 500 are contemplated. For example, the modulation circuit 504 is described as introducing the selected phase shift into the reference signal. However, the modulation circuit 504 can also be configured to introduce the selected phase shift into the feedback signal, as shown in system 550.

Figure 6:
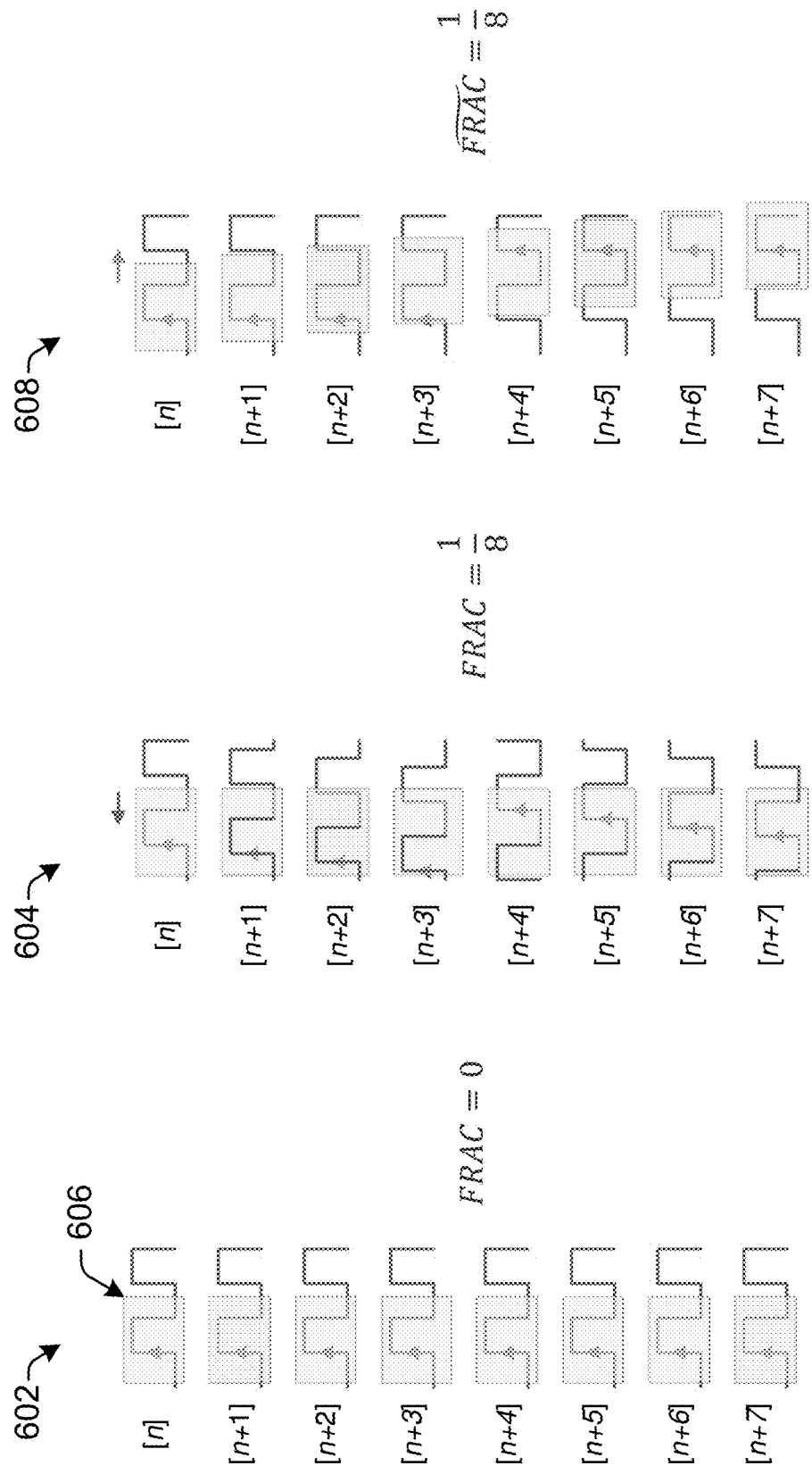
FIG. 6 is an illustration of the feedback signal in accordance with some embodiments.

FIG. 6 is an illustration 600 of the feedback signal 518 in accordance with some embodiments. The illustration 600 depicts a situation of division fraction FRAC=0 (602) and division fraction FRAC=⅛ (604) for a local oscillator and a sampling window (606) created by the reference signal 502 in accordance with some embodiments.

The figure clearly shows that for FRAC=0 (602) the feedback signal (518) waveform is stationary within the sampling window (606) whereas for FRAC=⅛ the waveform is advancing sample-to-sample, completing a full evolution cycle in precisely 8 time-steps.

It is appreciated that the illustration is provided as an example for illustrative purposes and that other quotients and/or fractions are contemplated.

A yet another example, would be that of a small fraction offset from an integer, such as FRAC=Δ_f=1/1024. This fraction means that 1024 reference clock cycles pass between two similar loop states. Thus, if the phase difference quantizer (such as the TDC 506) introduced an error at one or more of the relative phase states—it would have a cycle time of 1024 reference clocks and hence create a periodic phase error, manifested in the frequency domain as a comb of spurs at $$f_{spur}(n) = n \cdot f_{REF} \cdot \Delta_f \quad (4)$$

with distance between two adjacent ones equal to $f_{REF} \cdot \Delta_f$.

It is appreciated that phase quantization errors in the TDC (506) stem from integral-non-linearity (INL) and are fundamental to any known realization. Without the loss of generality, the INL is subject to the following dichotomy:

Time-invariant INL is typically captured and well treated by TDC calibration for the TDC 506.

Time-variant INL, generally stems from phase cross-modulation between a reference signal (502) and the feedback signal (518).

In a sampled system, such as a DPLL or the system 500, a frequency that exceeds the sampling bandwidth is wrapped back into the Nyquist range (from −

$$\frac{f_{REF}}{2}$$

to $$\frac{f_{REF}}{2}).$$

This means that the spur frequency is effectively $$f_{spur}(n) = f_{REF} \cdot \left[ \text{MOD}\left\{n \cdot FRAC + \frac{1}{2}, 1\right\} - \frac{1}{2} \right] \quad (5)$$

Where MOD stands for the modulus function. Considering the case of FRAC=½+Δ_f $$f_{spur}(n) = f_{REF} \cdot \left[ \text{MOD}\left\{n \cdot \left(\frac{1}{2} + \Delta_f\right) + \frac{1}{2}, 1\right\} - \frac{1}{2} \right] \quad (6)$$

$$f_{spur} = f_{REF} \cdot \left[ \text{MOD}\left\{\frac{n+1}{2} + n \cdot \Delta_f, 1\right\} - \frac{1}{2} \right] \quad (7)$$

Stemming from the above is the fact that for every even n, there is a close-in spur at:

$$f_{spur}(n=2k) = 2k \cdot f_{REF} \cdot \Delta_f \quad (8)$$

which freely traverses a loop filter, such as the DLF 512, and modulate the DCO 514, contributing a periodic phase error and effectively increasing the phase noise of the LO signal 520. Therefore, the above fractions FRAC=1/1024 and FRAC=513/1024 both constitute examples of a "bad fractions".

This can be easily generalized for any other fast evolving fraction (replacing 2 with the inverse of the fraction).

In general, it is appreciated that since the phase error evolution function is periodic, it can be approximated using a Fourier series. For finite power signals, the Fourier series is convergent with higher harmonics (larger n) power eventually diminishing to 0 (though not necessarily monotonically).

Figure 7:
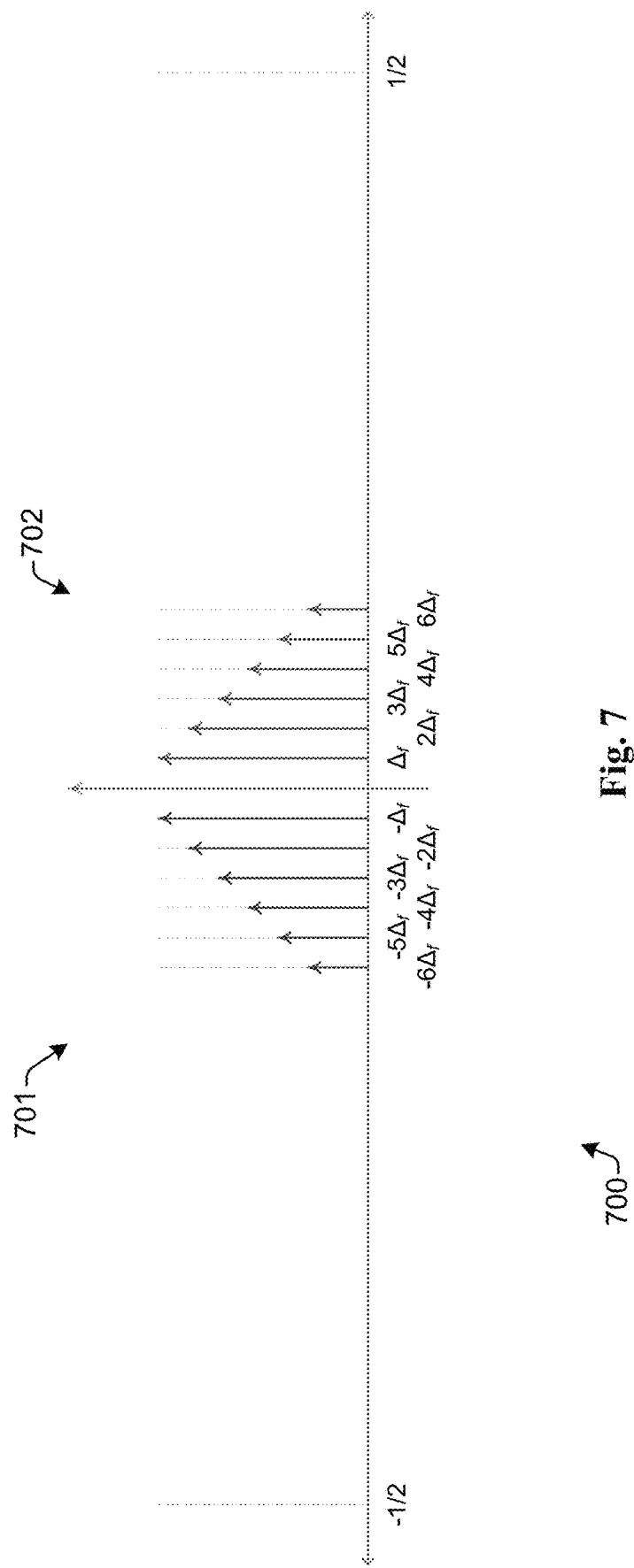
FIG. 7 is a diagram illustrating example/exemplary power spectral density of the phase detector error in accordance with some embodiments.

FIG. 7 is a diagram illustrating example/exemplary 700 power spectral density of phase detector error in accordance with some embodiments. The examples 700 are shown that depict an exemplary power spectral density of such quantization error in accordance with some embodiments of the invention. The examples 700 are provided for illustrative purposes.

The diagram depicts the power along a y-axis and frequency along an x-axis.

In this example, the fractional frequency is FRAC=Δ_f. Negative frequency offsets are shown on a left side 701 and positive frequency offsets are shown on a right side 702.

In general, fractions featuring a very small detuning (Δ_f) from a fast or very fast evolving fractions (integer, ½, ⅓, ¼, etc.) can have high spur levels because harmonics that wrap-around to land close to the carrier (at a small frequency offset) are still relatively powerful.

It's therefore proposed to alter the phase difference evolution path seen by the phase difference meter such as TDC 506 to closely resemble the evolution path of a moderate fraction—one for which the first harmonic that fall in adjacency to 0 offset (from the carrier) is significantly less powerful.

It is appreciated that the above intentional modulation can be also applied to the cases of Δ_f=0, namely, when a locking to exactly (very) fast fraction frequency. For these frequencies, the harmonics of the phase quantization error fall far from the carrier, hence no periodic errors (fractional spurs) generally arise. However, at different locking instances, the loop may suffers from differential non-linearity (effectively, gain inhomogeneity of the TDC 506. This phenomenon alters the actual loop gain to a suboptimal value, as the phase of the relative phase of the feedback signal is forced to dwell at a small number of different states within the TDC 506 (for example, in the integer case there would only be one such location). Applying intentional modulation to the reference signal (or alternatively, to the feedback signal), sweeps the relative phase across numerous locations averaging the loop gain and hence alleviating the problem of gain variations.

As stated above, the modulation circuit 504 introduces a phase modulation into the reference signal 502 to generate a phase-modulated or time-shifted reference signal 522 and generates a compensation signal 516. The introduced phase modulation is also referred to as an intentional modulation.

As a result of the introduced phase modulation, the sampling window for the TDC 506 is shifted by the modulation circuit 504 by a delay or shifted amount.

To further illustrate this, FIG. 6 is again referenced. The third column of FIG. 6, column 608, depicts sampling windows for various n values based on modulation at rate of about ⅛ (each sample is shifted by ~$T_{FB}/8$) such that the feedback (FB) signal waveform within the sampling window is all but identical to that at the same time-step in the second column 604, in which the relative phase evolved due to a real fractional frequency of FRAC=⅛. Hence, since the inputs to the TDC are all but identical to those experienced in case of FRAC=⅛ it would be a fair assumption, that the quantization error, and namely it's evolution in time would have a similar nature.

Applying the above logic to the $\Delta_f$=1/1024 case, yields a new fraction seen by the TDC of $\widehat{FRAC}$=⅛+$\Delta_f$ for which the folded frequencies become $$f_{spur}(n) = f_{REF} \cdot [\text{MOD}\{n \cdot (⅛+\Delta_f)+½, 1\} - ½] \quad (9)$$

And hence the closest in (to the carrier) spur, appearing at $f_{REF} \cdot \Delta_f$ offset will have n=8 and therefore, a substantially lower power, following Fourier series characteristics.

The introduced time-shift in the reference signal, which altered the apparent relative phase evolution path (of the feedback signal), must be removed (or compensated for), so that the loop converges to the correct frequency.

Figure 8:
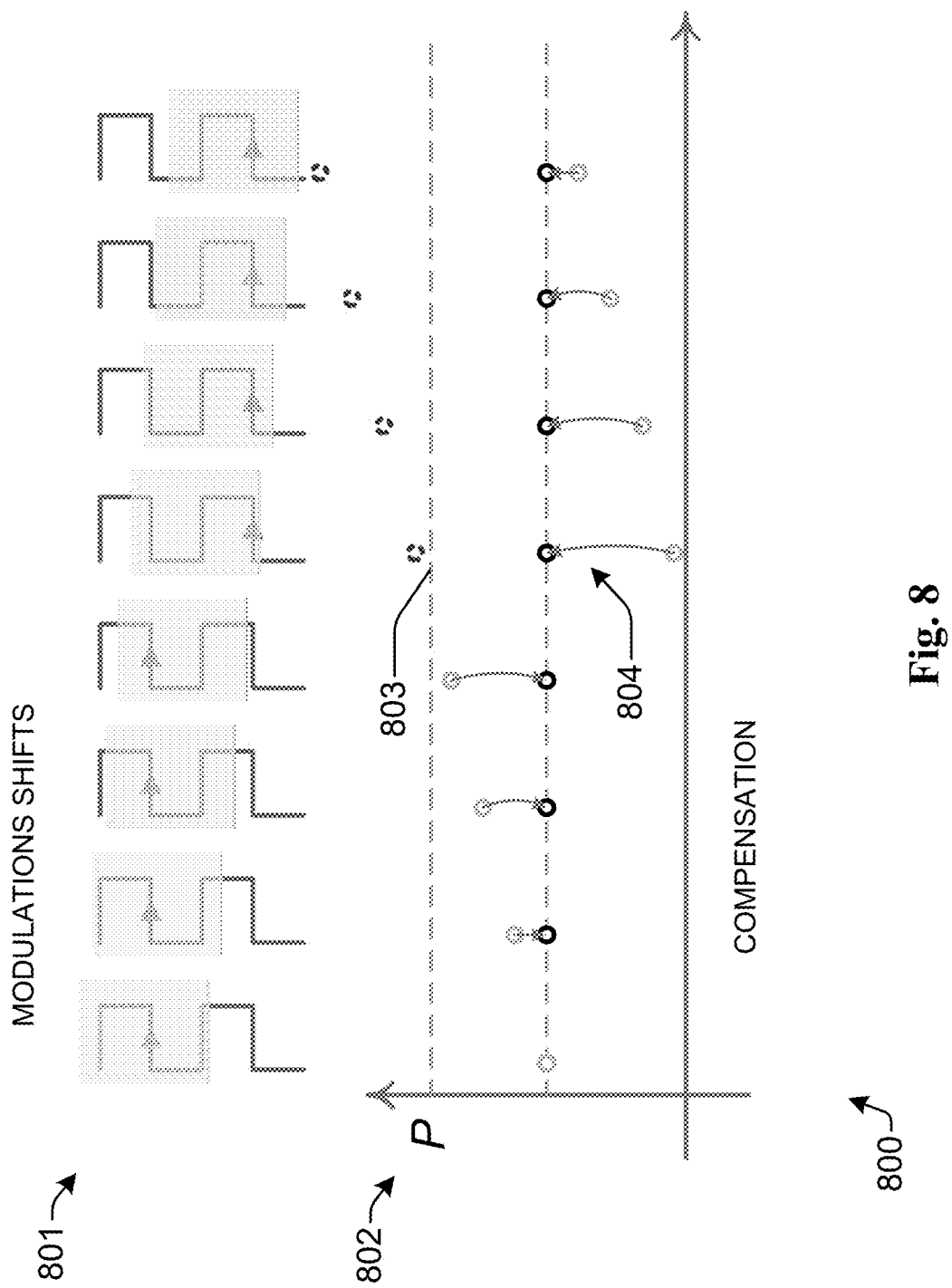
FIG. 8 is an illustration showing example modulation shifts and compensation in accordance with some embodiments.

FIG. 8 is an illustration 800 showing example modulation shifts and compensation in accordance with some embodiments. The illustration 800 is provided for illustrative purposes and it is appreciated that other phase modulation shifts, compensations and the like are contemplated.

The illustration includes an upper portion 801 that depicts example relative phase evolution of originally FRAC=0 feedback signal due to reference signal phase shifts introduced by the modulation circuit 504, which effectively causes the relative phase evolution to resemble that of FRAC=⅛ signal.

The illustration also includes a lower portion 802 that depicts compensations and resulting combinations of the compensations with an output from the TDC 506 as performed by the circuitry 508.

Time is shown along an x-axis and various phase values along a y-axis. An original or uncompensated sample values are shown in gray circles and a resulting compensated (output of the circuitry 508) are shown as black circles.

At a first sample or quantization (starting from the left), there should be no fractional part and the modulation circuit does not generate a delay/shift. At a second sample, there should be about P/8 fractional part, thus a small time shift (approximately $T_{FB}/8$) is introduced. At a third sample, there is also a larger fractional part (namely 2·P/8) and a larger shift is introduced (about 2·$T_{FB}/8$).

At a fifth sample, the shift causes the relative phase value to exceed the full period (equivalent of 2π in phase reporting units) value P 803 as shown by dotted circles, the phase measured by the TDC 506 experiences a wrap-around, which reports a 2π subtracted value (continuous gray circles). Compensation is finally introduced to correct the signal in circuitry 508 and bring it to the expected (constant) evolution line.

Figure 9:
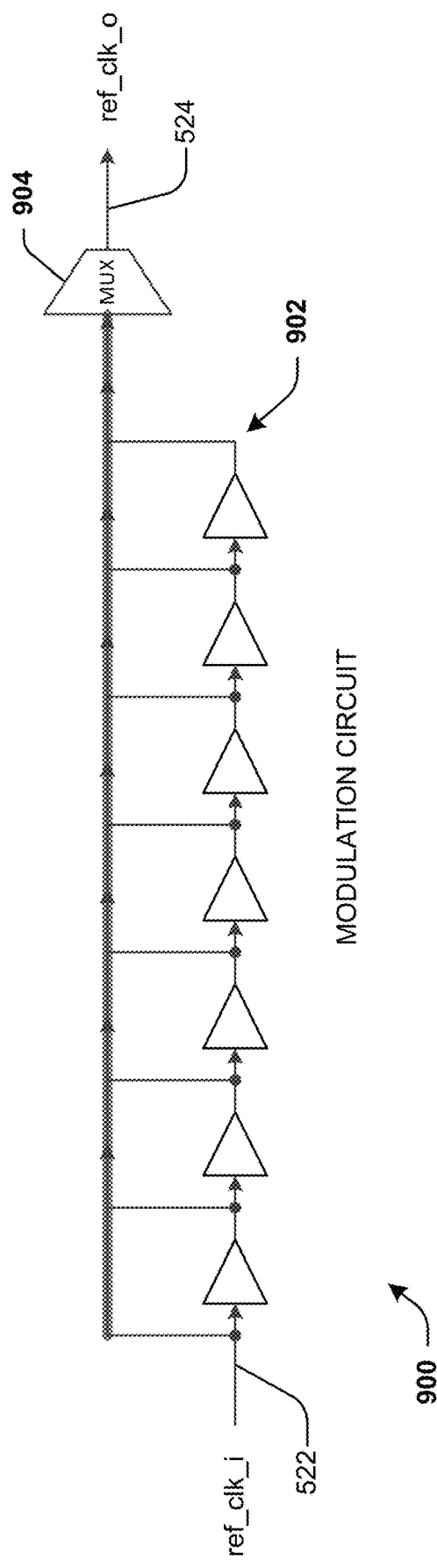
FIG. 9 is a diagram illustrating a modulation circuit in accordance with some embodiments.

FIG. 9 is a diagram illustrating a modulation circuit 900 in accordance with some embodiments. The modulation circuit 900 is provided as an example of a suitable modulation circuit 504 that can be used with the system 500 and the like.

It is appreciated that the modulation circuit 900 can include additional elements and that some elements have been omitted for illustrative purposes. For example, the circuit can include one or more processors as a control unit, a memory, and the like.

The circuit 900, in this example, includes 8 state selectable delay units configured in a selectable delay line 902 and a multiplexor 904 configured to combine (or merely select) outputs of the delay units. The circuit 900 receives the input reference signal 502 and generates a phase modulated reference signal 522 at its output. The phase modulated reference signal 522 can also be referred to as a delayed signal.

The delay line 902 is configured to provide different delay/modulation states, such as 8 different delay states which allow up to ⅛ modulation or modulation delay of approximately $T_{FB}/8$. The multiplexor 904 is configured to select and/or combine outputs of delay units of the delay line. The states can be activated, wherein an associated delay is included with a total delay of the delay line 902 and the states can be inactivated, wherein an associated delay is not included with the total delay of the delay line 902.

An average delay can be employed as a base compensation. The average delay can be derived by measurement, design simulation and the like. Residual errors that are not compensated manifest as a spurs at n/8 (for cyclic phase modulation employing 8 delay/modulation states) the reference frequency or greater from a carrier frequency for faster modulations (such as ¼ and ½). The residual errors from the greater frequency modulations are typically filtered by the DLF 512.

It is appreciated that the stage or unit can represent a modulation/delay state. Each state has an assigned value that can vary from values for other states. In one example, the assigned values are digital codes.

In one example, the delay introduced by each stage or unit is pre calibrated. An example of a suitable pre-calibration method is as follows:

Switch continuously between two adjacent stages of the delay chain

Use a maximum likelihood based filter to estimate an initial phase and frequency of an evolving phase slope (noise-less instantaneous phase can be represented as a first degree polynomial of measurement number).

Subtract between the estimation of the two initial phases above.

Repeat the operation for every two consecutive stages.

Cumulatively sum-up the differential delay to get total delay relatively to the reference clock input.

It is appreciated that other suitable techniques or methods for pre-calibration of the delay stages/units are contemplated.

Figure 10:
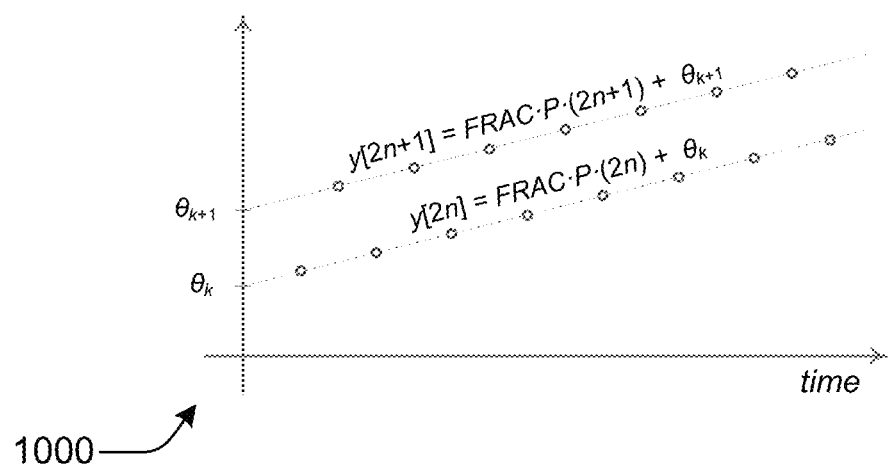
FIG. 10 is a diagram illustrating examples for a pre-calibration of a delay or modulation circuit in accordance with some embodiments.

FIG. 10 is a diagram illustrating examples 1000 for a pre-calibration of a delay or modulation circuit in accordance with some embodiments. The examples can be used with circuit 900 shown in FIG. 9.

Here, a pre-calibration is performed to assign delays to the various units or stages of the circuit.

A graph 1000 show computation of the delays/phase-shift.

An example of a suitable formula for pre-calibrating units or stages of a modulation circuit is provided below:

$$y[2n]=\text{FRAC}\cdot P\cdot(2n)+\theta_k \quad (10)$$

$$y[2n+1]=\text{FRAC}\cdot P\cdot(2n+1)+\theta_{k+1} \quad (11)$$

Where k is the stage/unit number.

Figure 11:
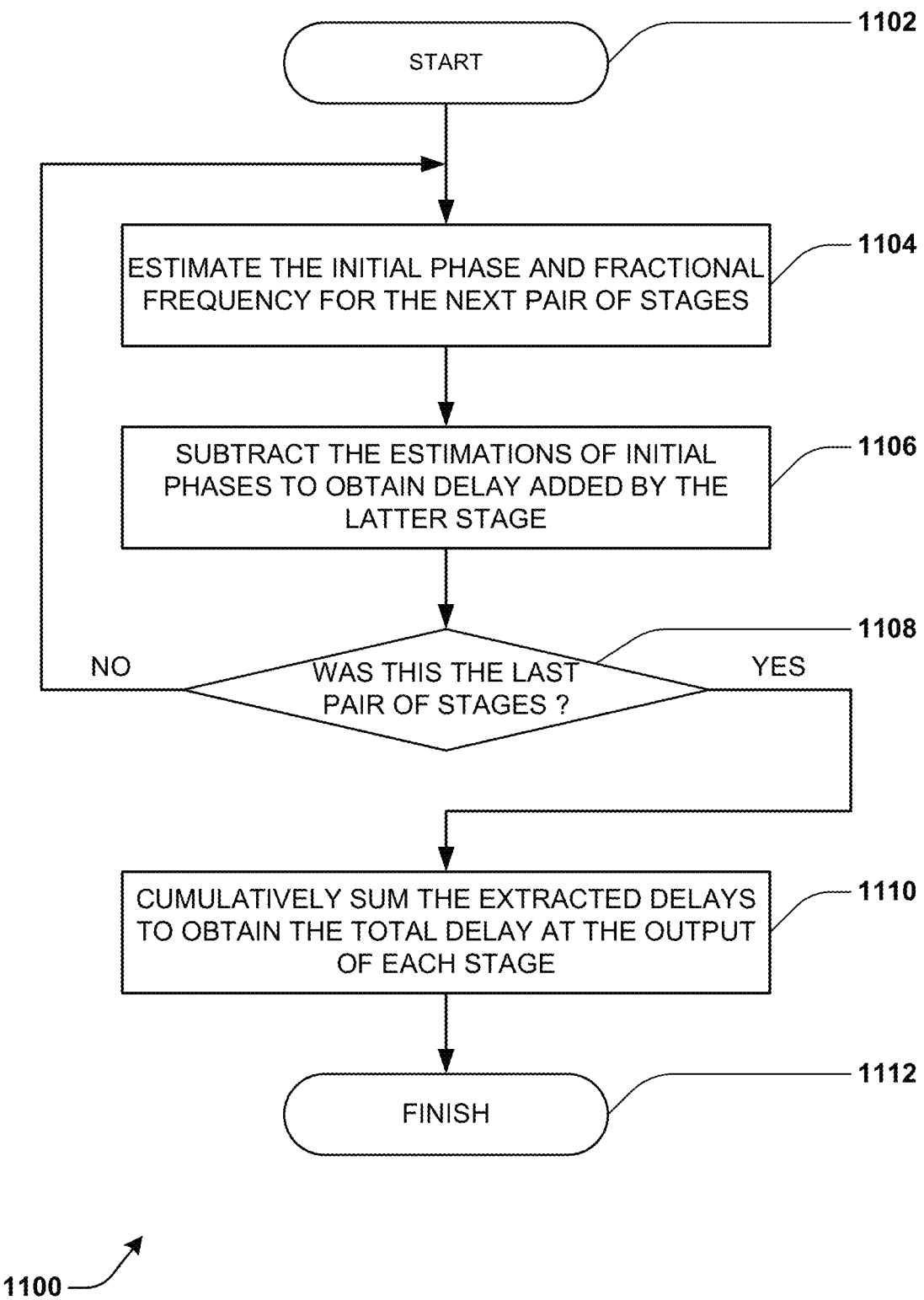
FIG. 11 is a flow diagram illustrating a method for calibrating and/or pre-calibrating a delay based modulation circuit in accordance with some embodiments.

FIG. 11 is a flow diagram illustrating a method 1100 for calibrating and/or pre-calibrating a delay stage modulation circuit in accordance with some embodiments. The method 1100 is provided for illustrative purposes and it is appreciated that suitable variations are contemplated.

The method 1100 can be used with the circuit 900, described above, to assign shift or delay values to stages or units of the circuit 900. It is appreciated that other suitable calibration methods and techniques are contemplated.

Further, the method 1100 can be performed using one or more processors executing instructions from memory, which can be located in or associated with circuitry such as the baseband circuitry and the like.

The method 1100 begins at block 1102, at which the PLL is brought to conditions which supports the calibration flow.

Then, an initial phase estimate is determined for the first pair of stages as well as the average fractional frequency at block 1104. In one example, a maximum likelihood based filter and an evolving phase slope are used to determine the initial phase and the average fractional frequency (FRAC) estimates. A noise-less instantaneous phase can be represented as a first degree polynomial of measurement number, as appears in equation (10) and (11) above.

As an example, a first stage and a second stage of the delay line 902 can be used as the first pair at block 1104.

A stage delay is determined at block 1106 by subtracting the estimation of the two initial phases and the average fractional frequency (FRAC).

With reference to the delay line 902, the delay for the first stage is based on subtracting the initial phase estimate for the first stage and the average fractional frequency (FRAC) from the initial phase estimate for the second stage.

Using loop control 1108, initial phase and average frequency estimation (1104) is repeated for every additional pair of stages as required.

With reference to the circuit 900, initial phase estimates are determined for the remaining pairs of the delay line 902, subsequent to the first stage.

Similarly, stage delays are determined for the subsequent pairs of adjacent delay stages of the delay line at block 1106.

The stage delays are cumulatively summed at block 1110 to obtain a total delay or total configurable delay for the delay line relative to a reference signal or reference clock.

The calibration ends at block 1112 with the compensation values ready and properly synchronized to the activation of any delay in 900.

It is appreciated that suitable variations of the method 1100 are contemplated, including incorporating additional blocks, omitting one or more blocks, and the like.

Figure 12:
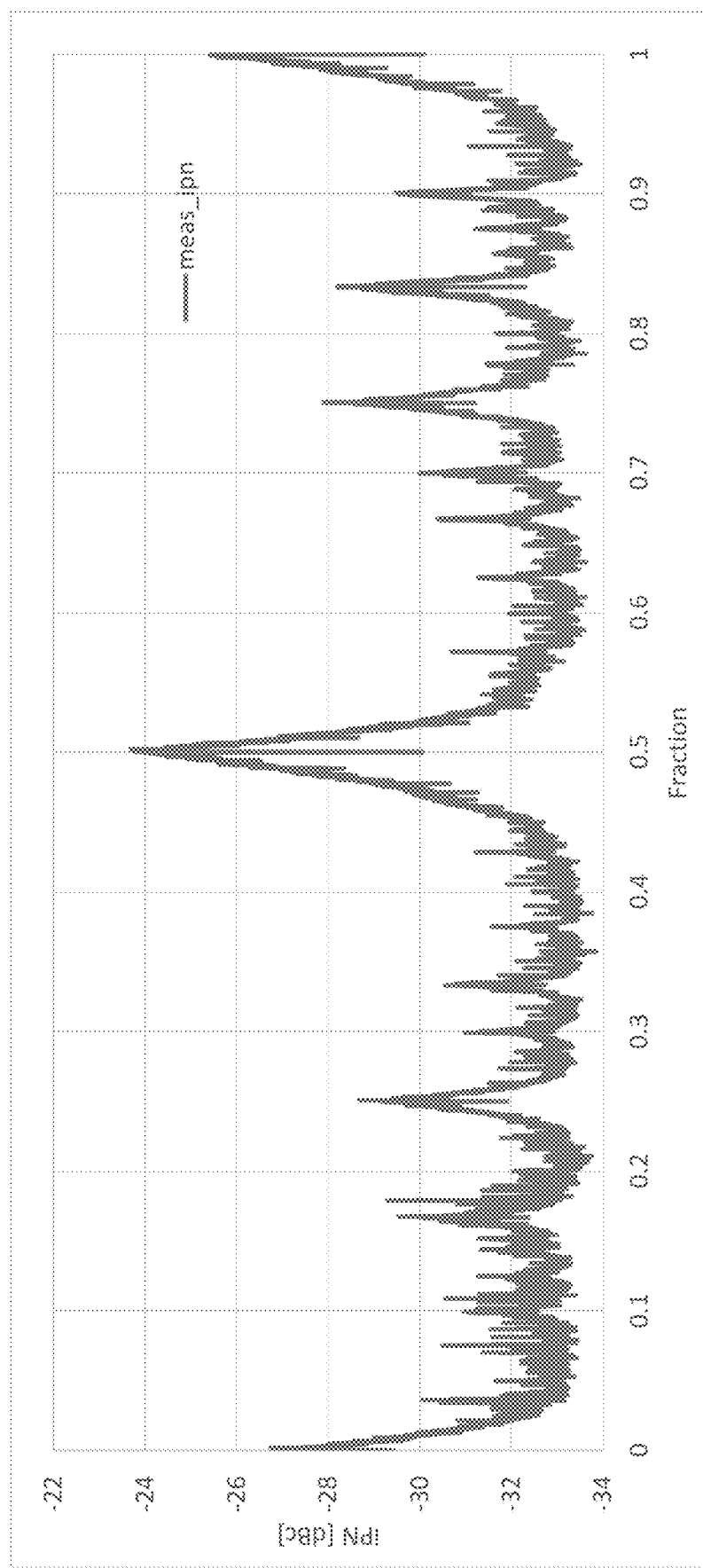
FIG. 12 is a map of measured integrated phase noise (iPN) vs. frequency fraction of an All-Digital PLL.

FIG. 12 depicts an integrated phase noise (iPN) vs. frequency fraction map 1300 of an All-Digital PLL.

The map 1200 depicts fractions along an x-axis and integrated phase noise along a y-axis.

Clearly seen are the phase noise degradations around an integer, ½ fraction, as well as ¼ and ¾ (which are essentially equivalent). Additionally, minor iPN degradations are also visible around additional fast evolving fractions such as ⅓, ⅙ and ⅚, and so on.

The map 1200 can be used by the modulation circuit 504 to determine the required fractional frequency shift amount. For example, a small detuning from 0.5 fraction feature, such as based on Eq (8), shown above. The modulation circuit 504 could determine that a shift fraction of 0.1 would mitigate the phase error sufficiently. Then, in operation, the modulation circuit 504 can shift a signal (reference or feedback signal) by the shift fraction to mitigate the phase error.

The impact of the modulation on each and every fraction can be directly inferred from shifting the fraction sweep by the intentional modulation/fraction.

This assumption is based on the equivalency of TDC input modulation to fractional frequency shift(s) owing to the fact that the phase evolution seen by the TDC is identical in the both cases (604 and 608 in 600).

In one example, having an 8 state reference phase modulator (as in 900), there is a total of 8 fractional rates possible, having a nominator of 1 through 7 and a denominator of 8.

Of the possible shifts, a shift is selected that results in an equivalent fraction that features at least a selected integrated phase noise performance (either by measurement or simulation) or a best integrated phase noise performance (either by measurement or simulation).

Figure 13:
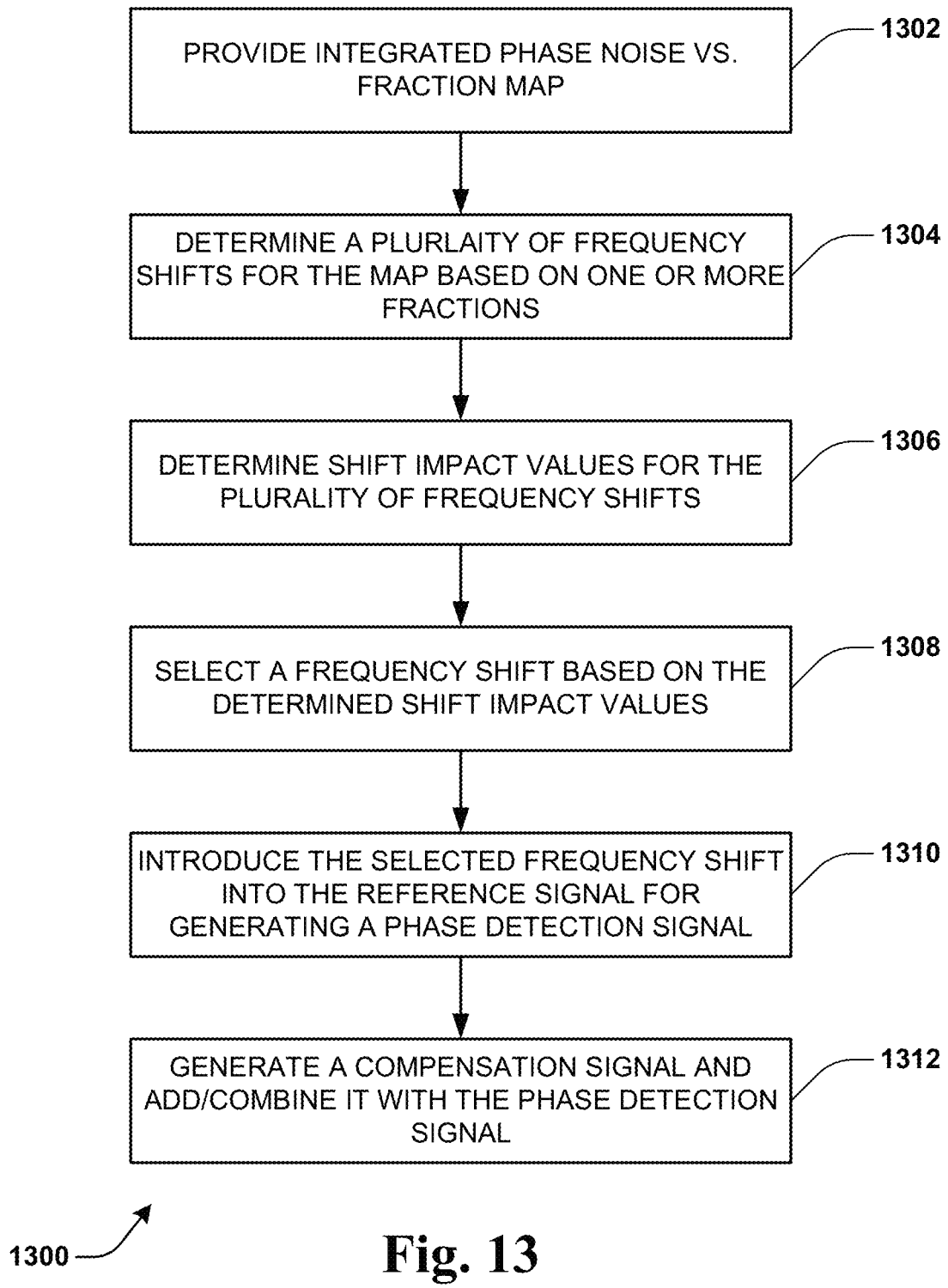
FIG. 13 is a flow diagram illustrating a method for mitigating nonlinearity phase noise degradation in accordance with some embodiments.

FIG. 13 is a flow diagram illustrating a method 1300 for mitigating nonlinearity phase noise degradation in accordance with some embodiments. The method 1300 is provided for illustrative purposes and it is appreciated that suitable variations are contemplated.

The method 1300 can be used to cause fractional phase values that cause substantial non-linear phase errors (referred to as "bad fractions") to operate as fractional phase values that have relatively low non-linear phase errors (referred to as "good fractions).

The method 1300 can be performed and is described with the above systems, such as the system 500. Further the method can be implemented using circuitry and/or processor, such as the front end module 115, the modulation circuit 504 and the like. Further, the method 1300 can be performed by the modulation circuit 504. Further, the method 1300 can be performed using one or more processors executing instructions from memory, which can be located in or associated with circuitry such as the baseband circuitry and the like.

The method 1300 begins at block 1302, where a map of integrated phase noise vs. fractional frequency (fraction) is provided (such as the map 1200). It is appreciated that the measured/simulated frequency grid does not need to be dense (contain a large number of x-values). The entire fractional frequency space can be broken into regions, with the decision attained by the algorithm 1300 being valid for any fractional frequency residing in the region.

A number or plurality of frequency shifts are contemplated for the reference map at block 1304. The plurality of frequency shifts are based on fractions or division fraction (FRAC) availed by the reference shift mechanism and the like.

Shift impact values for the number of frequency shifts of the reference map is/are determined at block 1306. The shift impact values can be measured, simulated, and the like.

A suitable shift is selected at block 1308 for each frequency or a set of frequencies based on the determined shift impact values. In one example, the suitable shift is selected that provides the highest or largest value or impact value. In another example, the suitable shift is selected that mitigates non-linear phase errors by the greatest amount or by an amount greater than a threshold value. In another example, The selected shift is used at block 1310 by the modulation circuit 504 to introduce the selected shift as a delay or intentional phase modulation to the reference map and/or reference signal.

A compensation or compensation shift is generated by the modulation circuit 504 to compensate or correct for the selected shift at block 1312. In one example, the compensation shift is provided to summation circuitry, such as circuitry 508, which combines the compensation signal with an output signal from the TDC 506.

It is appreciated that suitable variations of the method 1300 are contemplated, including incorporating additional blocks, omitting one or more blocks, and the like.

FIG. 5B is a diagram illustrating an alternative arrangement for an all digital phase locked loop (ADPLL) system 550 in accordance with some embodiments and/or aspects. The system 550 introduces phase modulation of a feedback signal to mitigate the non-linearity related phase detector errors.

The system 550 can be implemented in front end circuitry, such as the radio front end module 115, the radio front end module 215, the radio front end module 300, the radio front end module 325 and variations thereof. The system 550 can be used with user device 100, a base station or infrastructure equipment radio head 200 and the like.

The system 550 is provided at a high level to facilitate understanding. It is appreciated that other circuits and the like can be included. Additional details and examples are provided in subsequent figures and description.

The system 550 is substantially similar to the system 500 described above. However, the modulation circuit 504 is configured to introduce phase modulation into the feedback signal 518 to generate a shifted feedback signal 552. The shifted signal 552 is then received by the TDC 506.

As used herein, the term "circuitry" may refer to, be part of, or include an Application Specific Integrated Circuit (ASIC), an electronic circuit, a processor (shared, icated, or group), dedand/or memory (shared, dedicated, or group) that execute one or more, software or firmware programs a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," "data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a phase locked loop (PLL) system for mitigating non-linear phase errors. The system includes a modulation circuit and a time to digital converter (TDC). The modulation circuit is configured to generate a plurality of phase shifts for a reference signal; select a phase shift of the plurality of phase shifts and introduce the selected phase shift into one of a reference signal and a feedback signal to generate a phase shifted signal. The TDC is configured to generate a phase detection signal based on the phase shifted signal. The phase shift can be selected based on mitigating non-linear phase errors.

Example 2 includes the subject matter of Example 1, including or omitting optional elements, wherein the modulation circuit is configured to generate a compensation signal based on the introduced selected phase shift.

Example 3 includes the subject matter of any of Examples 1-2, including or omitting optional elements, further comprising circuitry configured to combine the compensation signal with the phase detection signal.

Example 4 includes the subject matter of any of Examples 1-3, including or omitting optional elements, wherein the plurality of phase shifts include fractional phase shifts.

Example 5 includes the subject matter of any of Examples 1-4, including or omitting optional elements, wherein the modulation circuit is configured to derive a fractional frequency of the feedback signal and utilize the derived fractional frequency to generate the plurality of phase shifts.

Example 6 includes the subject matter of any of Examples 1-5, including or omitting optional elements, wherein the modulation circuit is configured to determine a fraction based on the frequency of the feedback signal and the frequency of the reference signal and use the determined fraction to generate the plurality of phase shifts.

Example 7 includes the subject matter of any of Examples 1-6, including or omitting optional elements, wherein the modulation circuit includes a plurality of series connected delay units that are selectively activated to provide the selected phase shift.

Example 8 includes the subject matter of any of Examples 1-7, including or omitting optional elements, wherein the modulation circuit is configured to perform a calibration and assign a digital code to a plurality of modulation states.

Example 9 includes the subject matter of any of Examples 1-8, including or omitting optional elements, wherein the modulation circuity is further configured to activate one or more of the plurality of modulation states to generate the plurality of phase shifts.

Example 10 includes the subject matter of any of Examples 1-9, including or omitting optional elements, wherein the modulation circuitry is further configured to activate one or more of the plurality of modulation states to generate a compensation signal.

Example 11 is a phase locked loop (PLL) system for mitigating non-linear phase errors. The system includes a modulation circuit, a time to digital converter (TDC), adder circuitry, and a digitally controlled oscillator (DCO). The modulation circuit is configured to introduce a plurality of phase shifts to one of a reference signal and a feedback signal, generate a modulated phase signal based on the introduced plurality of phase shifts, and generate a compensation signal based on the introduced plurality of phase shifts. The TDC is configured to generate a phase detection signal based on the modulated phase signal. The adder circuitry is configured to combine the phase detection signal with the compensation signal to generate a compensated phase detection signal. The DCI is configured to generate a PLL output signal based on the compensated phase detection signal, wherein the feedback signal is based on the PLL output signal.

Example 12 includes the subject matter of Examples 11, including or omitting optional elements, wherein the modulation circuitry is configured to determine a fraction based on frequencies of the feedback signal and the reference signal and to generate the plurality of phase shifts based on the determined fraction.

Example 13 includes the subject matter of any of Examples 11-12, including or omitting optional elements, wherein the modulation circuitry is configured to activate one or more modulation states of a plurality of modulation states based on the feedback signal and the reference signal and to use the activated one or more modulation states to introduce the plurality of phase shifts.

Example 14 includes the subject matter of any of Examples 11-13, including or omitting optional elements, wherein the modulation circuit is configured to generate the compensation signal to compensate for the introduced phase shifts.

Example 15 includes the subject matter of any of Examples 11-14, including or omitting optional elements, wherein the TDC is configured to receive the feedback signal.

Example 16 includes the subject matter of any of Examples 11-15, including or omitting optional elements, wherein the modulation circuit is configured to perform a pre-calibration procedure and assign a code to each of a plurality of modulation states.

Example 17 includes the subject matter of any of Examples 11-16, including or omitting optional elements, wherein the modulation circuit includes a plurality of delay stages configured to provide the plurality of modulation states having the assigned codes.

Example 18 is a method of operating a phase locked loop (PLL). The method includes determining a fractional frequency of a feedback signal; generating a plurality of fractional frequency shifts by a modulation circuit based on the fractional frequency; selecting a fractional frequency shift from the plurality of fractional frequency shifts aimed at mitigating non-linear phase errors; introducing the selected fractional frequency shift into one of a reference signal and the feedback signal to generate as a phase modulated signal; and generating a compensation signal based on the selected fractional frequency shift.

Example 19 includes the subject matter of Example 18, including or omitting optional elements, wherein selecting the fractional frequency shift comprises selecting the shift that shifts the fractional frequency of the feedback signal from a bad fraction to a good fraction.

Example 20 includes the subject matter of any of Examples 18-19, including or omitting optional elements, further comprising compensating the phase modulated signal for the introduced fractional shift after quantizing the relative phase of the feedback signal by a time to digital converter (TDC).

Example 21 includes the subject matter of any of Examples 18-20, including or omitting optional elements, further comprising utilizing noise shaping techniques for introducing the selected fractional frequency shift.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). The techniques can also be used with new radio (NR) 5G, also from the 3GPP organization. Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A phase locked loop (PLL) system for mitigating non-linear phase errors, the system comprising:
    a modulation circuit configured to generate a plurality of phase shifts, select a phase shift based on the plurality of phase shifts and introduce the selected phase shift into one of a reference signal and a feedback signal to generate a phase shifted signal, the phase shifted signal having a relative phase shift between the reference signal and the feedback signal; and
    a time to digital converter (TDC) configured to generate a phase detection signal based on the phase shifted signal.

2. The system of claim 1, wherein the modulation circuit is configured to generate a compensation signal based on the introduced selected phase shift.

3. The system of claim 2, further comprising circuitry configured to combine the compensation signal with the phase detection signal.

4. The system of claim 1, wherein the plurality of phase shifts include fractional phase shifts.

5. The system of claim 1, wherein the modulation circuit is configured to derive a fractional frequency of the feedback signal and utilize the derived fractional frequency to generate the plurality of phase shifts.

6. The system of claim 1, wherein the modulation circuit is configured to determine a fraction based on a frequency of the feedback signal and a frequency of the reference signal and use the determined fraction to generate the plurality of phase shifts.

7. The system of claim 1, wherein the modulation circuit includes a plurality of series connected delay units that are selectively activated to provide the selected phase shift.

8. The system of claim 1, wherein the modulation circuit is configured to perform a calibration and assign a digital code to a plurality of modulation states.

9. The system of claim 8, wherein the modulation circuit is further configured to activate one or more of the plurality of modulation states to generate the plurality of phase shifts.

10. The system of claim 8, wherein the modulation circuit is further configured to activate one or more of the plurality of modulation states to generate a compensation signal.

11. A method of operating a phase locked loop (PLL) comprising:
    determining a fractional frequency of a feedback signal;
    generating a plurality of fractional frequency shifts by a modulation circuit based on the fractional frequency;
    selecting a fractional frequency shift from the plurality of fractional frequency shifts aimed at mitigating non-linear phase errors;
    introducing the selected fractional frequency shift into one of a reference signal and the feedback signal to generate a phase modulated signal; and
    generating a compensation signal based on the selected fractional frequency shift.

12. The method of claim 11, wherein selecting the fractional frequency shift comprises selecting a shift that shifts the fractional frequency of the feedback signal from a bad fraction to a good fraction.

13. The method of claim 11, further comprising compensating the phase modulated signal for the introduced fractional shift after quantizing a relative phase of the feedback signal by a time to digital converter (TDC).

14. The method of claim 11, further comprising utilizing noise shaping techniques for introducing the selected fractional frequency shift.

15. A method for a phase locked loop (PLL) system, the method comprising:
    generating a plurality of phase shifts using a modulation circuit;
    selecting a phase shift based on the plurality of phase shifts, at the modulation circuit, for mitigating non-linear phase errors;
    introducing the selected phase shift into one of a reference signal and a feedback signal to generate a phase shifted signal, the phase shifted signal having a relative phase shift between the reference signal and the feedback signal; and
    generating a phase detection signal based on the phase shifted signal using a time to digital converter (TDC).

16. The method of claim 15, further comprising generating a compensation signal at the modulation circuit, based on the introduced selected phase shift.

17. The method of claim 16, further comprising combining the compensation signal with the phase detection signal.

18. The method of claim 15, wherein the plurality of phase shifts include fractional phase shifts.

19. The method of claim 15, further comprising deriving a fractional frequency of the feedback signal at the modulation circuit and utilizing the derived fractional frequency to generate the plurality of phase shifts.

20. The method of claim 15, further comprising determining a fraction based on a frequency of the feedback signal and a frequency of the reference signal, at the modulation circuit and using the determined fraction to generate the plurality of phase shifts.

* * * * *